United States Patent
Nishida et al.

(10) Patent No.: US 10,840,449 B2
(45) Date of Patent: Nov. 17, 2020

(54) METHOD FOR PRODUCING RESIN FILM HAVING FINE PATTERN, METHOD FOR PRODUCING ORGANIC EL DISPLAY DEVICE, BASE FILM FOR FORMING FINE PATTERN, AND RESIN FILM PROVIDED WITH SUPPORTING MEMBER

(71) Applicant: HON HAI PRECISION INDUSTRY CO., LTD., New Taipei (TW)

(72) Inventors: Koshi Nishida, Osaka (JP); Kozo Yano, Osaka (JP); Katsuhiko Kishimoto, Osaka (JP); Susumu Sakio, Osaka (JP); Hideo Takei, Osaka (JP)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 152 days.

(21) Appl. No.: 15/764,868

(22) PCT Filed: Jul. 22, 2016

(86) PCT No.: PCT/JP2016/071617
§ 371 (c)(1),
(2) Date: Mar. 29, 2018

(87) PCT Pub. No.: WO2017/056656
PCT Pub. Date: Apr. 6, 2017

(65) Prior Publication Data
US 2019/0044069 A1 Feb. 7, 2019

(30) Foreign Application Priority Data
Sep. 30, 2015 (JP) ................. 2015-193881

(51) Int. Cl.
*H01L 51/00* (2006.01)
*C23C 14/04* (2006.01)
(Continued)

(52) U.S. Cl.
CPC ........ *H01L 51/0011* (2013.01); *C23C 14/042* (2013.01); *H01L 27/3244* (2013.01);
(Continued)

(58) Field of Classification Search
None
See application file for complete search history.

(56) References Cited

U.S. PATENT DOCUMENTS

2003/0150384 A1   8/2003   Baude et al.
2015/0328662 A1*  11/2015  Mizumura .............. C23C 14/04
                                                         427/556

FOREIGN PATENT DOCUMENTS

CN    1633518 A        6/2005
JP    20050014043 A    1/2005
(Continued)

*Primary Examiner* — Nathan T Leong
(74) *Attorney, Agent, or Firm* — ScienBiziP, P.C.

(57) ABSTRACT

A method for producing a resin film by using a resin material and accurately forming a fine pattern as a vapor deposition mask or an optical element, a method for producing an organic EL display device, a base film for forming a fine pattern and a resin film with a supporting member are provided. A liquid resin material is applied onto a supporting member to form a resin coating film (S1), and a temperature of the resin coating film is increased to a temperature at which the resin material cures, to form a baked resin film (S2). Thereafter, a base film formed by the baked resin film attached to the supporting member is processed by irradiating with lasers, to form a resin film (1b) having a desired fine pattern and the supporting member (S3). Thereafter, the baked resin film on which the fine pattern is formed is peeled from the supporting member, and the resin film having the fine pattern is obtained (S5).

9 Claims, 10 Drawing Sheets

(51) Int. Cl.
*H01L 27/32* (2006.01)
*H01L 51/56* (2006.01)
*H01L 51/52* (2006.01)

(52) U.S. Cl.
CPC ............ *H01L 51/001* (2013.01); *H01L 51/56* (2013.01); *H01L 27/3211* (2013.01); *H01L 51/5281* (2013.01)

(56) References Cited

FOREIGN PATENT DOCUMENTS

| | | | |
|---|---|---|---|
| JP | 2005-519187 | * | 6/2005 |
| JP | 20050519187 | A | 6/2005 |
| JP | 20140067500 | A | 4/2014 |
| JP | 20160074938 | A | 5/2016 |
| TW | 201447498 | A | 12/2014 |
| TW | 201522677 | A | 6/2015 |
| WO | 2013039196 | A1 | 3/2013 |
| WO | WO2013039196 | * | 3/2013 |
| WO | 2014115477 | A1 | 7/2014 |
| WO | WO2014115477 | * | 7/2014 |
| WO | 2015034097 | A1 | 3/2015 |

* cited by examiner

METHOD FOR PRODUCING RESIN FILM HAVING FINE PATTERN, METHOD FOR PRODUCING ORGANIC EL DISPLAY DEVICE, BASE FILM FOR FORMING FINE PATTERN, AND RESIN FILM PROVIDED WITH SUPPORTING MEMBER

TECHNICAL FIELD

The present invention relates to a method for producing resin film having fine pattern by laser processing to form fine pattern, a method for producing an organic EL display device, a base film for forming fine pattern and a resin film with supporting member; more particularly relates to a method for producing a resin film obtained by forming a precise fine pattern without burrs during laser processing, a method for producing an organic EL display device, a base film for forming fine pattern and a resin film with supporting member.

BACKGROUND ART

In the case of producing an organic EL display device, for example, an organic layer is laminated on a substrate having TFTs formed corresponding to each pixel. Therefore, a vapor deposition mask is disposed on the substrate, organic material is vapor-deposited by the vapor deposition mask, and the necessary organic layer is deposited only on the necessary pixels. As the vapor deposition mask, a metal mask has been conventionally used, but in recent years, a resin mask has been often used to substitute the metal mask (for example, see Patent Literature 1).

Figure 16:
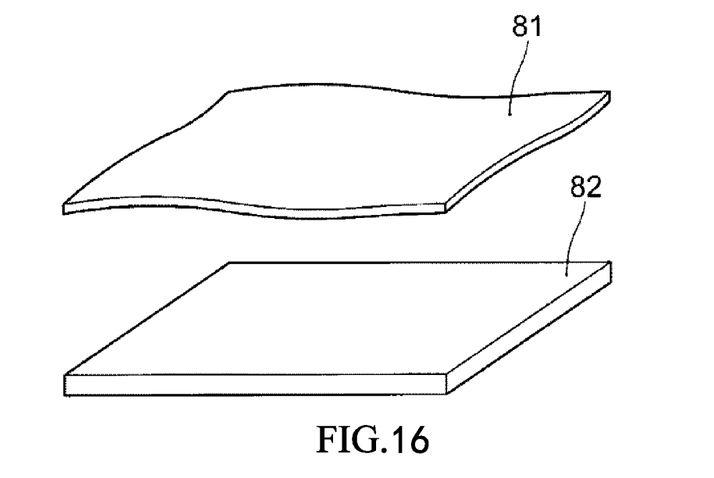
FIG. 16 is a view illustrating an example of forming a vapor deposition mask using a conventional resin film.
Figure 17:
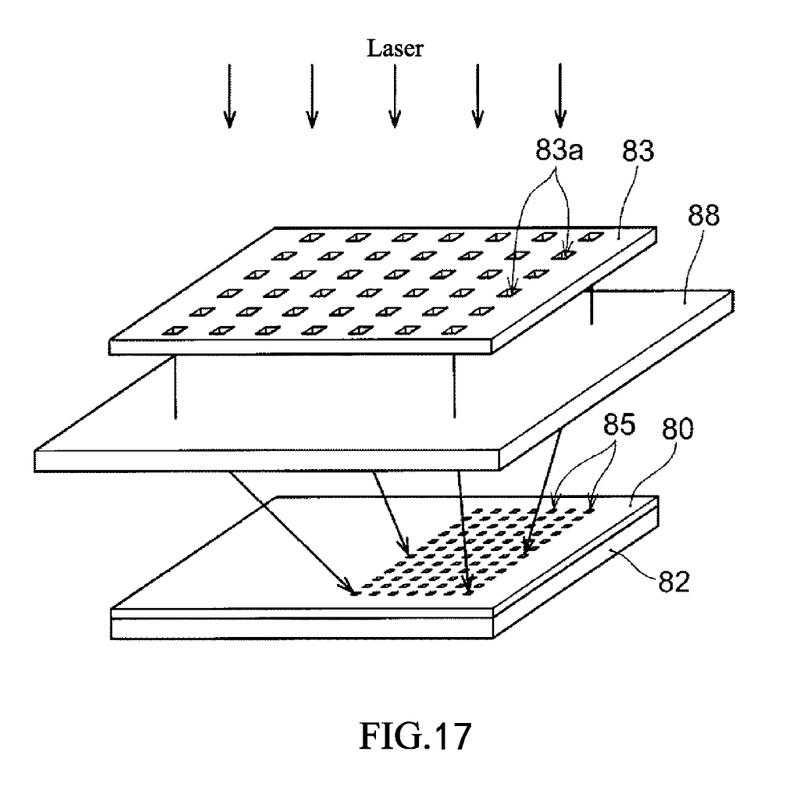
FIG. 17 is a view illustrating an example of forming a vapor deposition mask using a conventional resin film.

A method for producing a vapor deposition mask formed by such a resin film, for example as shown in FIG. 16, a resin thin film 81 is attached on a supporting member 82. Thereafter, for example as shown in FIG. 17, laser is irradiated through a mask 83 having a desired pattern 83a and an optical lens 88 as necessary from a surface side of the resin thin film 81, to form a resin film 80 having a desired fine pattern 85 transformed from an opening pattern 83a of the transfer mask 83.

In addition, optical elements having a fine pattern on a surface thereof, such as a diffraction grating having a lattice-shaped groove on a surface thereof or a light-antireflective film having fine concaves-convexes on the surface thereof, is produced also by similarly laser irradiation to the resin thin film 81 attached to the supporting member 82 to form the fine pattern.

PATENT LITERATURE

PTL 1: Japanese Patent Application Publication No. 2013-124372

SUMMARY OF INVENTION

Technical Problem

As described above, when the resin film having the opening pattern is used as a vapor deposition mask to produce an organic EL display device, a pixel area may increase or decrease depending on different pixels, or thicknesses of the deposited organic layers may be different. In this way, when the laminating state of the organic layers varies according to the pixels, there is a problem that display quality of the display device may be decreased.

In addition, even in the case of manufacturing the optical element, this optical element requires a very fine pattern of a nanometer level substantially equivalent to wavelengths of light, but depending on cases, the fine pattern may be not uniform and cannot obtain desired optical characteristics.

The inventors of the present invention conducted intensive studies and investigated the reasons of this problem. As a result, it is found that if the resin film and the supporting member do not closely adhere to each other, burrs may form on the periphery or uneven boundary portions during the finely processing to form openings or concaves-convexes in the resin film, or due to floating resulted from peeling of the thin film, non-uniform deposition of the organic material or non-uniform of the fine pattern is caused.

The present invention has been made to solve such a problem, an object of the present invention is to provide a method for producing a resin film having an opening pattern as a vapor deposition mask used for producing an organic EL display device, or a resin film having a fine pattern, such as a diffraction grating, an anti-reflection film, or the like which has a finer pattern than that of the vapor deposition mask.

Another object of the present invention is to provide a method for producing an organic EL display device using a vapor deposition mask formed by the resin film having the fine pattern.

It is still another object of the present invention to provide a base film which uses a resin material and can correctly form a fine pattern of a vapor deposition mask or an optical element.

A further object of the present invention is to provide a resin film having a supporting member in which a fine pattern is formed on a base film.

Solution to Problem

A method for producing a resin film having a fine pattern according to the present invention, characterized in that: applying a liquid resin material to a supporting member to form a resin coating film; forming a baked resin film by increasing a temperature of the resin coating film at which the resin material cures and baking the resin coating film; irradiating laser on the baked resin film attached to the supporting member to form a desired pattern of the baked resin film; and peeling the resin film from the supporting member.

A method for producing an organic EL display device according to the present invention, characterized in that: forming opening pattern in a baked resin film by irradiating with lasers to form a vapor deposition mask, wherein the baked resin film is formed by applying a liquid resin material to a supporting member and baking; aligning the vapor deposition mask with and superimposing it on a substrate on which a first electrode are formed, and vapor depositing organic material on the substrate to form an organic layer; and removing the vapor deposition mask to form a second electrode.

A base film for forming a fine pattern by laser processing according to the present invention includes: a supporting member; a short-wavelength light absorbing layer formed on a side of the supporting member, spreading over an entire region of the fine pattern, and closely attached to the supporting member; and a baked resin film, formed on a surface of the short-wavelength light absorbing layer opposite to the supporting member, spreading over an entire region of the fine pattern, and closely attached to the short-wavelength light absorbing layer.

Herein, the short-wavelength light is specifically a light having a wavelength of more than 300 nm and less than 400 nm, and primarily means light having a wavelength be absorbed by the light-absorbing layer. Therefore, it may not be a laser. In addition, it is not necessarily limited to this wavelength, and it may be light that excessively absorbed by the resin film without damage. In addition, "closely attach" means that no gap portion is formed between the supporting members or the like, for example, the gap portion is consisted of air bubbles or the like having a width (length) of more than 100 nm, preferably more than 10 nm. Herein, the gap portion refers to a region where the supporting member is not in contact with the baked resin film, and the gap between the supporting member and the like, for example has a gap of larger than 10 nm.

A resin film with a supporting member according to the present invention includes: a supporting member; a short-wavelength light absorbing layer formed on a side of the supporting member; and a baked resin film formed on a surface of the short-wavelength light absorbing layer opposite to the supporting member, and forming an opening pattern used for a vapor deposition mask or a concave-convex pattern used for an optical element, spreading over an entire region of the opening pattern or the concave-convex pattern; the supporting member and the short-wavelength light absorbing layer are closely adhered together, and the short-wavelength light absorbing layer and the baked resin film are closely adhered together.

Advantageous Effects of Invention

The method for producing a resin film having a fine pattern according to the present invention includes: applying a liquid resin material to a surface of the supporting member at least over the entire pattern formation region. Therefore, the liquid resin material flows to lick the surface of the supporting member and form a resin coating film closely attached to the supporting member. By baking the resin coating film, the baked resin film and the supporting member are closely attached to each other through an interface layer formed during the baking. Therefore, it would not occur that air bubbles generated when a conventional resin film is attached to the supporting member. Therefore, when the opening pattern of the vapor deposition mask or the fine pattern of the optical element is formed by irradiating laser light from an upper surface side, the processing is performed in a state of being closely attached to the supporting member. As a result, no processing dust is generated or no floating of the resin film (resin baking film) at ends of the openings. When the resin film (baked resin film) is peeled from the supporting member, if the peeling is performed by irradiating with laser or the like of short-wavelength light, as no excessive force is applied to the baked resin film, and the resin film can be peeled without any deformation.

The method of manufacturing an organic EL display device according to the present invention includes: a vapor deposition mask used for depositing an organic layer is a vapor deposition mask using a resin film formed by applying a liquid resin material onto a supporting member and baking it. As an opening pattern of the vapor deposition mask used for depositing the organic layer is formed by a very precise constant pattern, no deformation or floating of the ends of the openings is produced. As a result, when the organic layer is deposited using the vapor deposition mask, the organic layer of each pixel has an extremely accurate size and the organic layer of each layer has a constant laminated structure. Therefore, an organic EL display device having a very good display quality is obtained.

The base film according to the present invention includes: a baked resin film formed by a short-wavelength light absorbing layer closely attached to the supporting member. In other words, the resin baking film and the short-wavelength light absorbing layer, and the short-wavelength light absorbing layer and the supporting member are closely attached to each other and are over the entire region where the fine pattern is formed, and no air bubble is introduced. Therefore, even if the laser beam is emitted from a side of a surface of the baked resin film to perform fine laser processing, the baked resin film is processed in a state of closely attached to the supporting member by the short-wavelength light absorbing layer. As a result, floating of the baked resin film does not occur at the ends of the openings. That is, if air bubbles exist between the baked resin film and the supporting member, when the baked resin layer is cut by the laser processing at the air bubble portion, the ends of the openings of the baked resin layer will be in a state of floating and bulging, and the floating portion will be torn off and scattered as processing dust, but in the present invention, it is processed in a state that the entire baked resin film is closely attached to the supporting member. As a result, the formed fine pattern also is very high precisely processed. Therefore, the opening pattern of the vapor deposition mask or the fine patterns of the optical elements such as diffraction grating are also formed in a very precise pattern. In addition, the resin film (baked resin film) can be easily separated from the supporting member by irradiating with short-wavelength light because the short-wavelength light absorbing layer is formed at the interface between the resin film and the supporting member.

As described above, the resin film having a supporting member according to the present invention has a fine pattern formed in an accurate size. Therefore, the resin film that formed by peeling the baked resin film from the supporting member can be used as a vapor deposition mask or an optical element.

DESCRIPTION OF EMBODIMENTS

Figure 1:
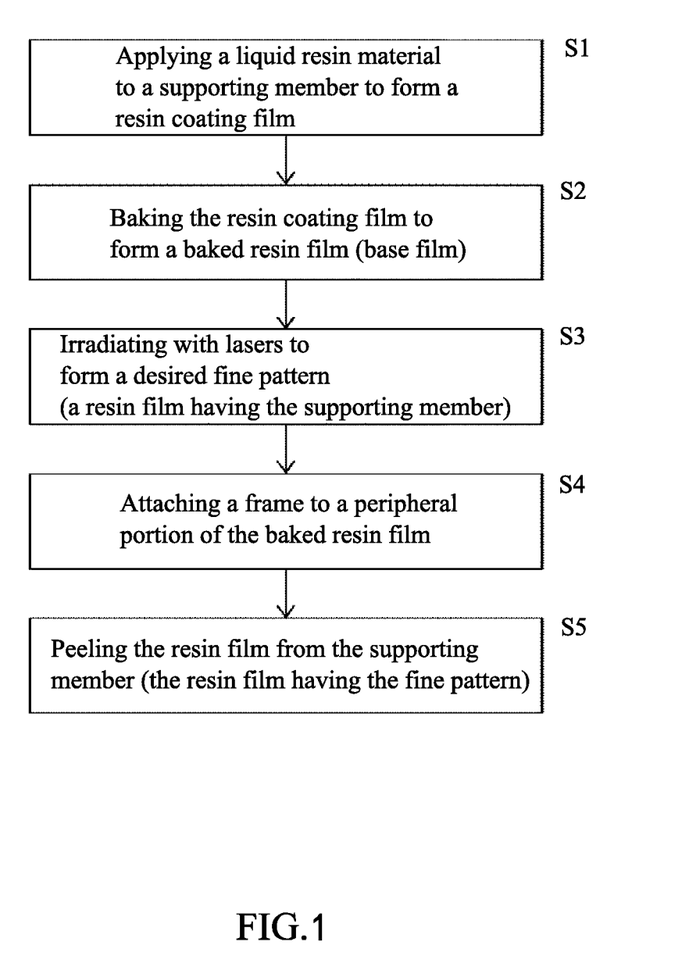
FIG. 1 is a flowchart showing a producing method of a resin film according to one embodiment of the present invention.

Next, a method for producing a resin film having a fine pattern according to the present invention, a base film for forming the resin film and for forming a fine pattern formed by laser processing, and a resin film having a supporting member will be described with reference to FIG. 1. FIG. 1 is a flowchart showing a method for producing a resin film according to an embodiment of the present invention, and FIG. 2 through FIG. 6 illustrates plan and cross section views in each step thereof, respectively.

Figure 2:
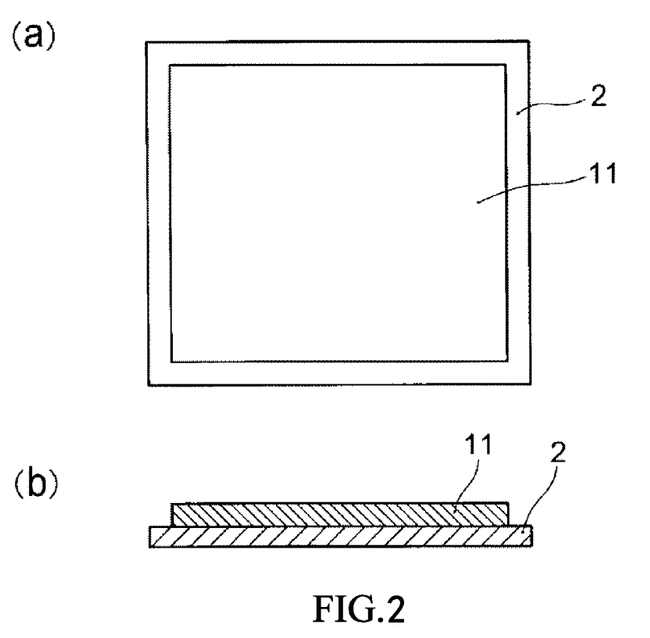
FIG. 2 is a plan and cross-section view illustrating an S1 step of the producing method of FIG. 1.

As shown in FIG. 1 and FIG. 2 through FIG. 6, a method for producing a resin film 1 having a fine pattern according to a present embodiment includes coating a liquid resin material 11a (see FIG. 7) to a supporting member 2 to form a resin coating film 11 (S1, FIG. 2). The resin coating film 11 is baked by increasing a temperature of the resin coating film 11 to a curing temperature of the resin material 11a to form a baked resin film 12 (S2, FIG. 3). In this situation, a thickness of the baked resin film 12 is thinner than a thickness of the resin coating film 11. Moreover, during the baking, a short-wavelength light absorbing layer 13 is formed at an interface between the baked resin film 12 and the supporting member 2. Thus, a base film 1a according to one embodiment of the present invention is formed. Then, laser is irradiated to the base film 1a in which the baked resin film 12 attached to the supporting member 2, forming a resin film 1b having a desired fine pattern 3a and a supporting member (S3, FIG. 4). Thereafter, the baked resin film 12 (resin film 1) having the fine pattern 3 formed is peeled from the supporting member 2 to obtain a resin film 1 having a fine pattern (S5, FIG. 6). Moreover, in S4 of FIG. 1 and FIG. 5, a frame 4 is attached to a peripheral portion of the baked resin film 12 having the fine pattern 3. The frame 4 is configured to facilitate separating the resin film 1 from the supporting member 2, and is not necessarily required. In addition, step (S4, FIG. 5) of assembling the frame 4 is not limited in an order of S2→S3→S4 as shown in FIG. 1, but can be performed after formation of the baked resin film 12 (S2), as an order of S2→S4→S3.

Figure 3:
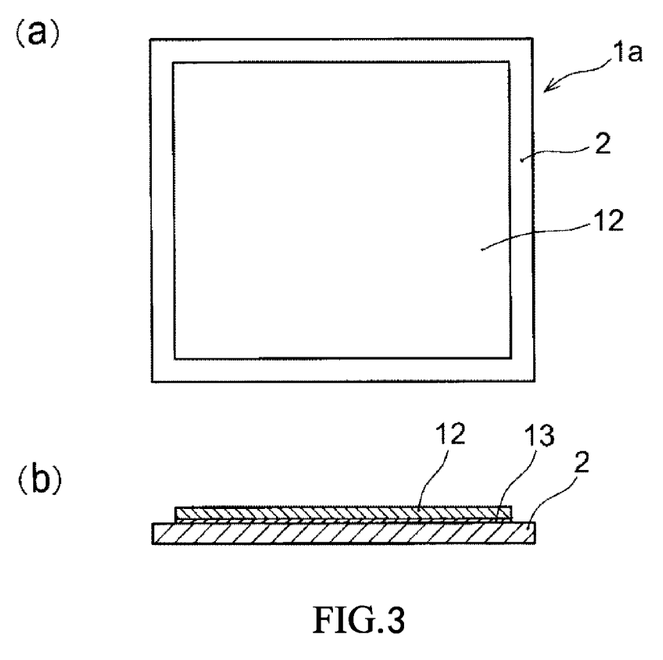
FIG. 3 is a plan and cross-section view illustrating an S2 step of the producing method of FIG. 1.

As shown in FIG. 3, the base film 1a of the present embodiment for forming a fine pattern by laser processing, is formed with the supporting member 2 and the short-wavelength light absorbing layer 13, wherein the short-wavelength light absorbing layer 13 is formed on a side of the supporting member 2 over a entire region of the fine pattern 3 (see FIG. 4) and is closely attached to the supporting member 2. Then, the baked resin film 12 is formed and closely attached to the short-wavelength light absorbing layer 13 on a surface of the short-wavelength light absorbing layer 13 opposite to the supporting member 2 and over the entire region where the fine pattern 3 (see FIG. 4) is formed.

Figure 4:
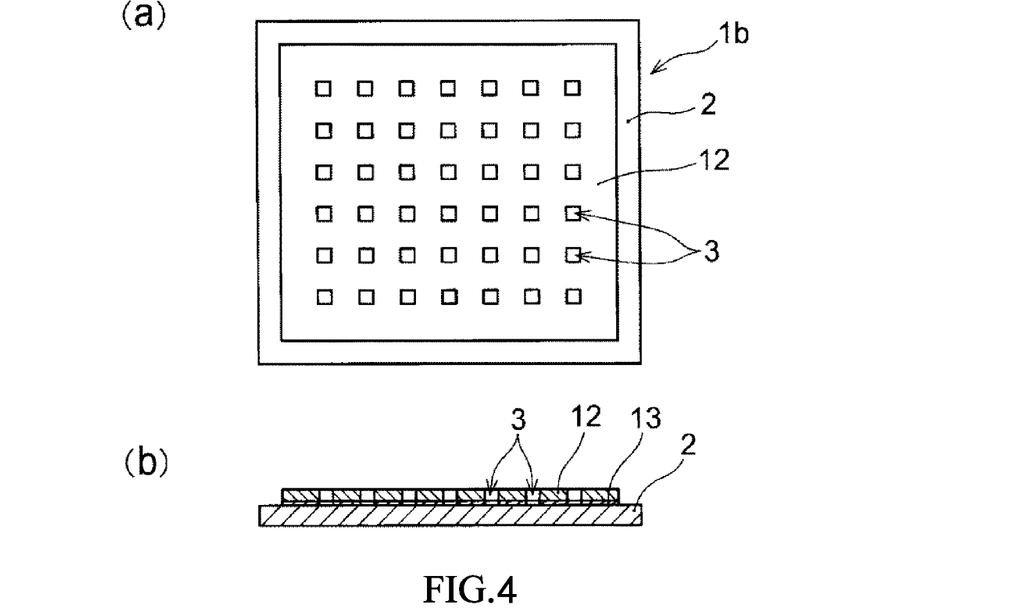
FIG. 4 is a plan and cross-section view illustrating an S3 step of the producing method of FIG. 1.

In addition, as shown in FIG. 4, the resin film 1b having a supporting member according to the present embodiment includes the supporting member 2, the short-wavelength light absorbing layer 13 formed on a surface of the supporting member 2, and the baked resin film 12 (resin film 1) formed on a surface of the short-wavelength light absorbing layer 13 opposite to the supporting member 2, wherein the baked resin film 12 forms the fine pattern 3 that can be an opening pattern for a vapor deposition mask or a concavo-convex pattern for an optical element. Thereafter, the short-wavelength light absorbing layer 13 and the supporting member 2 are closely attached to each other over the entire region where the fine pattern 3 is formed, and the short-wavelength light absorbing layer 13 and the baked resin film 12 (resin film 1) are closely attached to each other.

That is, the present invention, has the following characteristics: the supporting member 2 is coated with the resin material 11a and baked so as to form the resin baked film 12 closely attached to the supporting member 2, and microfabrication is performed by laser in this state. The reason for this configuration will be described below.

Figure 12:
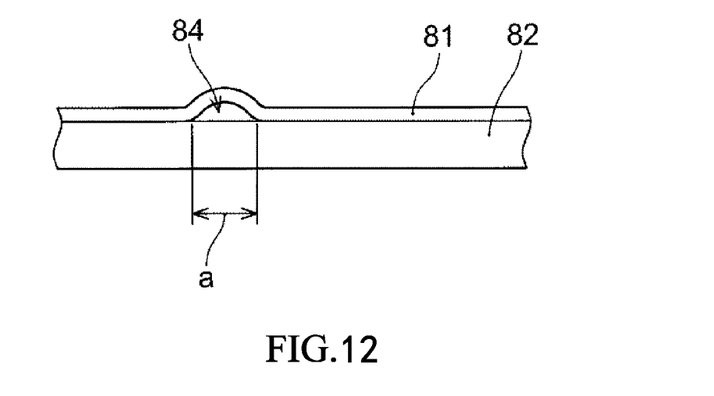
FIG. 12 is a view illustrating a problem in attaching a resin film to a supporting member in order to form a laser-processed resin film.

For example, a vapor deposition mask for producing an organic EL display device, as shown in FIG. 16 and FIG. 17, when a resin film 81 is attached to a supporting member 82 and an opening pattern 85 is formed in the resin film 81 through a mask 83 by laser processing, there is a problem that the display quality of the organic EL display device is degraded. In addition, the optical element such as a diffraction grating made from such a resin film 81 may have a problem that a beautiful diffraction image cannot be obtained. For this reason, the inventors of the present invention have conducted intensive studies and investigated, and a result is found that the reason is that when the fine pattern is formed by the laser processing, ends of the openings are floated or the processing dust is attached to the ends of the openings. As a result of further investigation and investigation of the result, it was found that, as shown in FIG. 12, when attaching the resin film 81 to the supporting member 82, even if a liquid such as alcohol is applied for attachment, air bubbles 84 are introduced, the air bubbles 84 have a length of several micrometers to tens of micrometers or submicron (hundreds of nm) or less cannot be distinguished under the microscope. These air bubbles 84 are a cause of burrs or processing dust.

Figure 13:
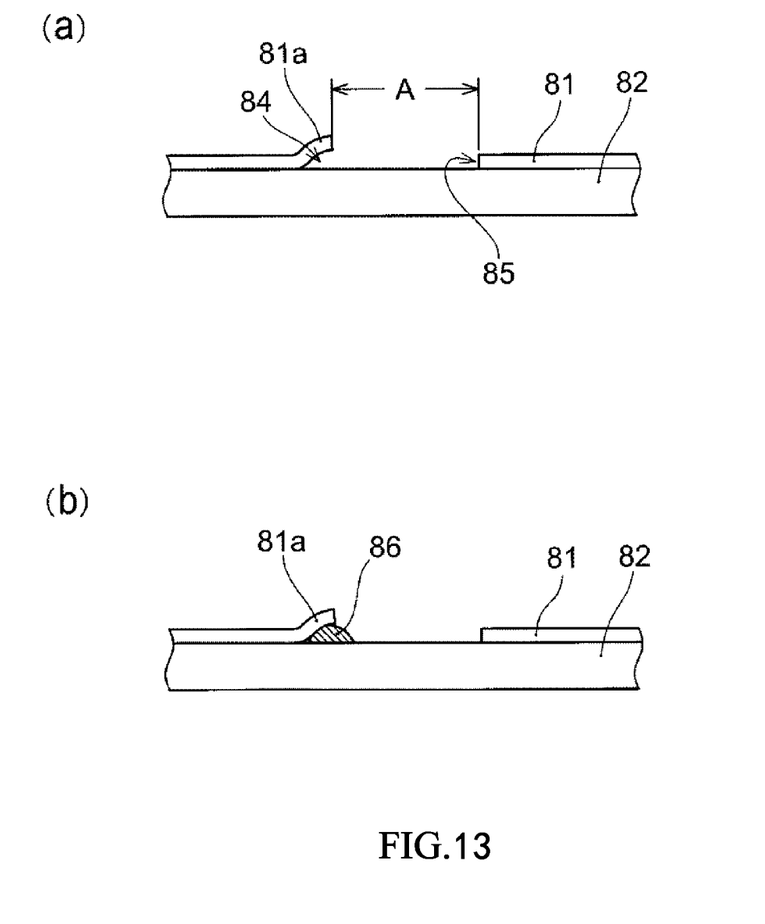
FIG. 13 is a view illustrating a problem that occurs when an opening is formed by laser processing in a state of FIG. 12.

That is, as shown in FIG. 13, when the pattern of the opening 85 is formed in the portion of the air bubble 84 (A indicates the width (about 60 μm) of the opening 85) even if the air bubble 84 has the length of about several μm or less, the portion of the air bubble 84 may be cut off. As a result, as shown in FIG. 13 (a), the resin film 81 after the patterning is formed, forms with a bulge portion (floating portions) 81a protrude on the portion of the air bubble 84, alternatively as shown in FIG. 13 (b), The processing dust 86 enters into an inner side of the bulge portions 81a and is integrated with the resin film 81 to reduce the size of the openings 85. Although not shown in the figure, there is a case that drooping of the floating portions due to the air bubbles causes the openings to become small. As described above, the size of such air bubble 84, which is usually several hundred nanometers or less, is often overlooked. However, the inventors of the present invention conducted extensive studies to find that the introduction of these tiny air bubbles 84 is the cause of bad influence.

Figure 14:
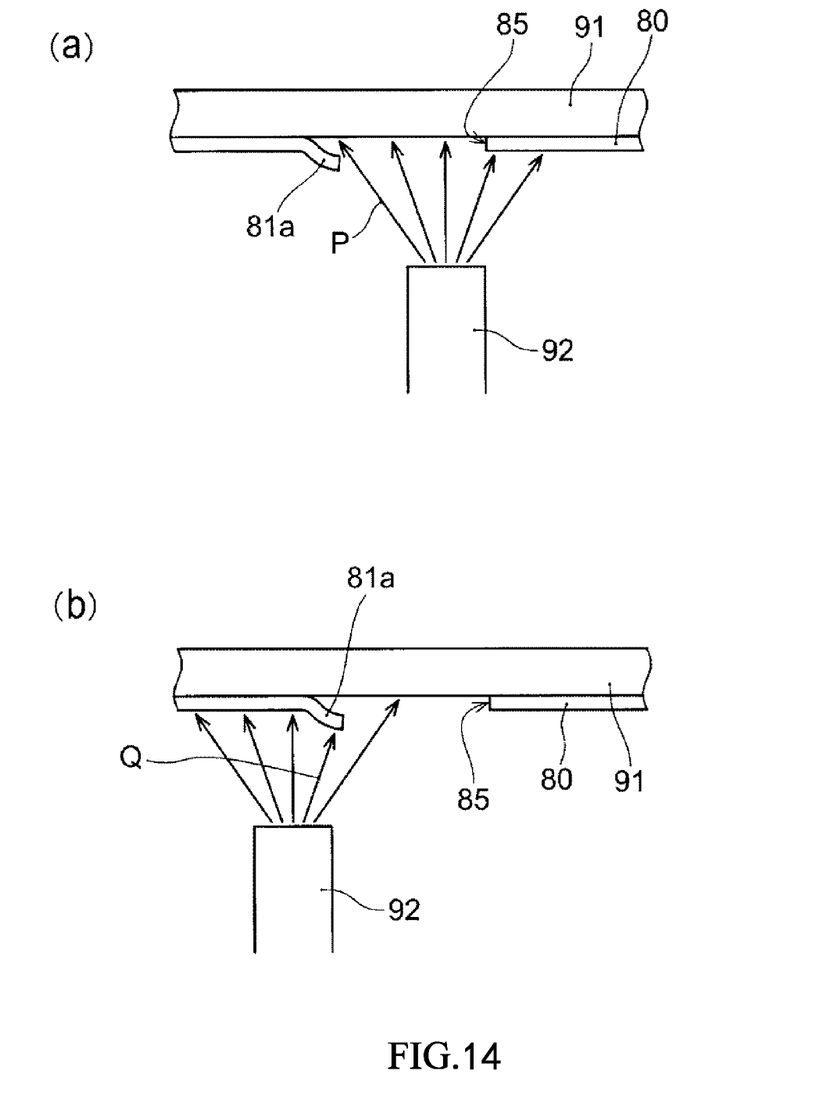
FIG. 14 is a view illustrating a problem in depositing an organic material using a vapor deposition mask of FIG. 13 (a).

Reason for decline of the display quality of the organic EL display device when the bulge portion 81a is formed on the resin film 81 or the processing dust 86 adheres to the resin film 81 is explained. As shown vapor-depositing of the organic material in FIG. 14, the vapor deposition mask 80 formed by the resin film 81 is fixed to a device substrate 91 such as a substrate of the organic EL display device, organic material which is a vapor deposition material is evaporated from the crucible 92 used for vapor deposition, the organic material (only arrows) is laminated on the device substrate 91 exposed from the opening 85 of the vapor deposition mask 80. At this time, when the bulge portions 81a are formed at ends of the openings 85, the organic layer cannot be deposited exactly. In other words, even if the crucible 92 serving as a deposition source may be a point source, a line source, a surface source, and the like, however, in the case of a point source or a line source, the device substrate 91 and the deposition source (the crucible 92) are relatively moving while proceeding the vapor-deposition. This case is a part of an example in which the line source is schematically shown in (a) and (b) of FIG. 14. When the bulge portions 81a are formed at the ends of the openings 85 of the deposition mask 80, the organic material P also sneaks into a lower side of the bulge portions 81a (only indicated by an arrow). In addition, as shown in FIG. 14 (b), there is a case that a portion of the organic material Q (indicated by arrows) of the organic material that should laminated on the device substrate 91 is blocked by the bulge portion 81a and cannot reach the device substrate 91.

Figure 15:
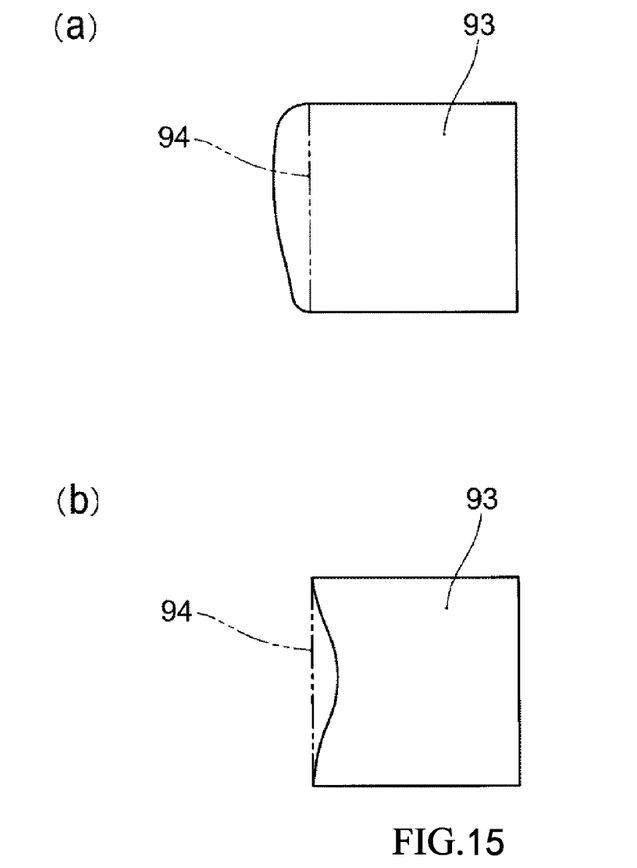
FIG. 15 is a view showing a formation example of the organic layer on a vapor deposition surface when the organic material is vapor-deposited using the mask shown in FIG. 13.

In this manner, when the bulge portions 81a are present, the pixels of the device substrate 91 after vapor deposition of the organic material become larger than a desired pixel region 94 (indicated by a double dot dash line) as shown in FIG. 15 (a), or become a pixel 93 lacking a part of the pixel as shown in FIG. 15 (b), or a portion where a thickness of the deposited organic layer is less than a desired thickness, though not shown. The state shown in FIG. 15 (b) may occur, for example, in the case of processing dust 86 attached on the vapor deposition mask 80 having the resin film 81 as shown in FIG. 13 (b).

Based on these findings, the inventors of the present invention conducted intensive studies in order to closely attach a resin film that forms a resin film having a fine pattern such as a vapor deposition mask to a supporting member. As a result, it was found that by coating the liquid resin material 11a (see FIG. 7) onto the supporting member 2 and further baked, due to no air bubble, the resin film 1 (baked resin film 12) closely attached to the supporting member 2 was obtained. By applying the liquid resin material 11a in such way, the resin material 11a is applied in a manner of flowing on the supporting member 2. Therefore, air bubbles are hardly to be introduced. For example, even if air bubbles are introduced, the resin coating film 11 has a thickness of more than about 3 µm and less than about 10 which is very thin, so that the air bubbles easily escape from the upper side of the resin coating film 11. In particular, in the subsequent baking step, time is prolonged by a relatively low temperature in an initial stage of baking, thus, for example, even if air bubbles are contained in the baking step, when the applied resin material 11a has fluidity, the temperature of the air bubbles is increased and the air bubbles escape from the surface side. Therefore, there is almost no air bubble between the resin coating film 11 formed by coating and the supporting member 2, thereby forming the resin coating film 11 (see FIG. 2) closely attached to the supporting member 2. In addition, region necessary to be closely adhered is where the fine pattern is formed in the coating film, and regions other than this region may not adhere closely. The method for producing the resin film 1 having a fine pattern according to the present invention, which is based on the findings of the inventors of the present invention as described above, will be described in more detail by way of specific examples.

Figure 7:
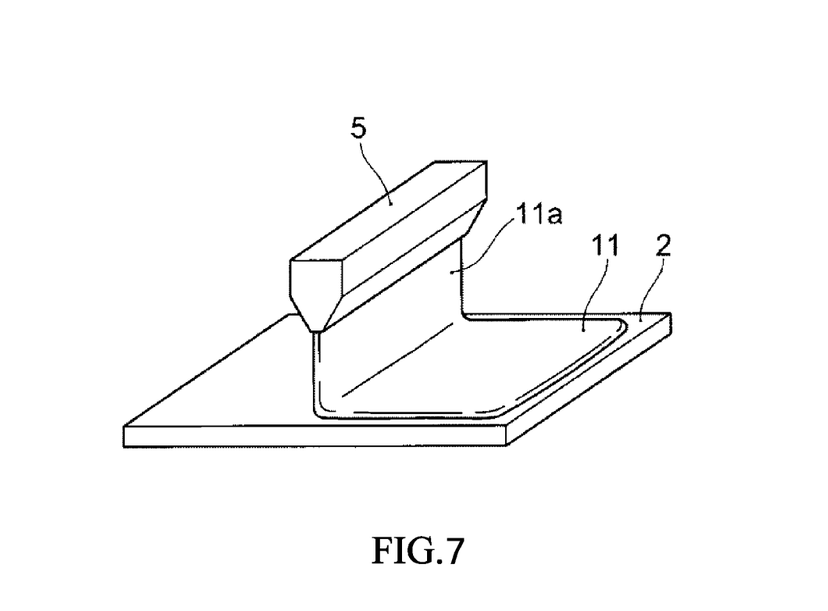
FIG. 7 is a view showing one example of forming a resin coating film of FIG. 2.

First, as shown in FIG. 2, the resin coating film 11 is formed by coating a liquid resin material on the supporting member 2 (S1 in FIG. 1). Coating of the resin material may use any method able to control thickness of the film. For example, as shown in FIG. 7, coating is performed using a slit coating method. That is, the resin material 11a is supplied to a slit die 5 and at a same time the resin material 11a is disgorged from a tip end of the slit die 5 in the form of stripes, meanwhile the slit die 5 is sequentially moved. Even if disgorging amount of the resin material 11a is not completely uniform, it becomes a flat surface having a uniform surface after several minutes. Then, as described above, there is no air bubble of 100 nm or more between the supporting member 2 and the resin coating film 11, and the resin coating film 11 closely attached to the supporting member 2 is at least formed over the entire fine pattern forming region. In addition, even if the resin material 11a may be coated not by slit coating method, but by any other method such as spin coating. Although the spin coating is unsuitable for material efficiency in the case of forming a large resin film, the resin coating film 11 that is closely attached to the supporting member 2 and has a flat surface can be obtained.

The resin material 11a is a material that can be baked, and may be a laser material that absorbs laser-processed. However, when the resin film 1 is used as a vapor deposition mask, as described above, it is preferable that the substrate on which the vapor deposition mask is placed is made of a material that having a linear expansion coefficient close to a linear expansion coefficient of the supporting member 2 on which the resin coating film 11 is formed. Since a glass plate is generally used as a substrate of an organic EL display device, polyimide is preferable from this viewpoint. Polyimide is a general term of polymer resins including imide polymerization, and imidization reaction is promoted by heating and baking polyamic acid (liquid at normal temperature) as a precursor to obtain a film-like polyimide amine. In addition, since the linear expansion coefficient can be adjusted by the baking conditions, the linear expansion coefficient of the substrate or the supporting member 2 of the organic EL display device is easily matched. Although the general linear expansion coefficient of polyimide is more than 20 ppm/° C. and less than 60 ppm/° C., which can approximate to 4 ppm/° C. of the glass's linear expansion coefficient depending on baking conditions. For example, the rate of linear expansion coefficient can be reduced by a higher-temperature and longer-time baking. Other substrates such as a resin film may be used as the device's substrate instead of the glass plate, and a resin material that matches the linear expansion coefficient of the substrate may be selected. In addition to the polyimide, for example, a transparent polyimide, PEN, PET, COP, COC, PC, or the like may be used.

The supporting member 2, which is a substrate configured for coating a resin material and baking, is formed of a material that has no unnecessary concave-convex on its surface and is resistant to the baking temperature. The no unnecessary concave-convex means that for example when a mask such as a vapor deposition mask is formed, there is no other concave-convex other than predetermined concave-convexes. When the resin film 1 is used as a vapor deposition mask, the supporting member 2 is preferably made of a material that has a small difference in linear expansion coefficient with respect to a substrate using the vapor deposition mask (for example, a substrate of an organic EL display device).

That is, when a resin film made of resin material is used as a vapor deposition mask for an organic layer of an organic EL display device, as the vapor deposition mask is fixed on a substrate on which an organic layer is formed, when there is a large difference between the linear expansion coefficients of the vapor deposition mask and the substrate, the vapor deposition region intended to be the substrate's pixel may deviate from the opening position of the deposition mask. For example, the size of one side of the display panel is 100 cm, the size of one side of the opening (sub-pixel of each color in the organic layer to be deposited) is 60 and when an allowable value of the positional deviation is 9 μm (15% of 60 μm), then a temperature increasing by 3° C. (the temperature increase during vapor deposition) may allow 9 μm. Although size of the sub-pixel is one example when the size of one side of the display panel is 100 cm, one side of a display panel generally changes proportionally with one side of a sub-pixel, if they have a same resolution. For example, if a display panel of 50 cm attempts to have a same resolution (the resolution is 5.6 k in the example), the length of one side of the sub-pixel is 30 μm. Therefore, the allowable value of the position deviation is 4.5 μm (15%) allowed by a length of 50 cm. That is, since the linear expansion coefficient of 4.5 μm/50 cm at 3° C. is allowed, the linear expansion coefficient is 3 ppm/° C., which holds true even for display devices of any size.

Therefore, a difference between the linear expansion coefficient of the vapor deposition mask and the linear expansion coefficient of the substrate using the mask needs to be less than 3 ppm/° C. On the other hand, when a difference between the linear expansion coefficient of the resin film 1 made of the resin material and the linear expansion coefficient of the supporting member 2 is great, the resin film 1 having a fine pattern formed by laser processing is peeled from the supporting member 2 at room temperature, the resin film 1 is easily curled under influence of thermal stress. The temperature for baking the resin coating film 11 is relatively high to be more than 400° C. and less than 500° C., and the difference in sizes after actual expansion is large. However, since the formation of the fine pattern by laser processing is performed at room temperature, there would be no problem of pattern position obviation. However, when a laser beam having a very small pulse width is irradiated for femtoseconds during laser processing, the resin film's expansion under local heating rarely causes any problem. However, in the case of a laser with a pulse width for a normal pec, several degrees celsius temperature may increase. Therefore, a difference between the linear expansion coefficients of the resin film 1 and the supporting member 2 is also preferably less than about 3 ppm/T. That is, a difference between the linear expansion coefficient of the substrate used as a vapor deposition mask and the linear expansion coefficient of the supporting member 2 is considered to be ±3 ppm/° C., preferably less than 6 ppm/° C., and more preferably less than 3 ppm/T.

Glass is typically used as the supporting member 2. The reason for this is that the resin-resistant film 1 has a baking temperature of more than 400° C. and less than 500° C., and glass is often used as a substrate of an organic EL display device for a vapor deposition mask. However, it is not limited to glass, sapphire and GaN-based semiconductor, or the like may also be used.

Next, as shown in FIG. 3, the baked resin film 12 is formed by increasing the temperature of the resin coating film 11 to a curing temperature of the resin material 11*a*, for example, by baking the resin coating film 11 and increasing the temperature to 450° C. (S2 of FIG. 1). At the time of baking, a short-wavelength light absorbing layer 13 is formed at an interface between the baked film 12 and the supporting member 2. As the resin coating film 11 contacts with the supporting member 2 made of a material different from the resin material, the short-wavelength light absorbing layer 13 is formed by modification of the contact surface of the resin material 11*a*. As a result, it becomes easier to absorb short-wavelength lights (such as ultraviolet lights) than the resin material 11*a*. The thickness is in a range of 5 nm to 100 nm. In order to form such a layer that absorbs short-wavelength light particularly easily, it is preferable to first coat the supporting member 2 with an extremely thin surface-modifying agent (such as silane coupling agent or the like) layer to improve surface adhesion, and then to form a resin coating film 11 before the baking. By baking, the base film 1*a* having the baked resin film 12 closely attached to the supporting member 2 and produced by micro-fabrication is obtained. In addition, although it is impossible in the present invention, if the resin coating film 11 is floated on the supporting member 12 and the short wavelength light absorbing layer 13 is not formed in the floating portion, a gap portion is formed between the baked resin layer 12 and the supporting member 12.

The baking is carried out, for example, by heating the whole in an oven without independently heating the supporting member 2. However, it is also possible to heat from the inner side of the supporting member 2. The temperature distribution during the heating can be changed according to the purpose.

First, as described above, when the resin coating film 11 is baked, it is necessary to surely prevent any air bubble from being introduced. As described above, since the resin coating film 11 is formed by coating the liquid resin material 11*a*, the air bubbles are rarely introduced. However, the air bubbles may be introduced when the liquid resin material 11*a* is applied to the supporting member 2. Therefore, initial stage of baking is preferably maintained at a temperature of less than 100° C. for more than about 10 minutes and less than 60 minutes. Heating at a low temperature for a long period is preferable to release the air bubbles introduced into the resin coating film 11 from a surface of the resin coating film 11. Curing would not occur if it is less than 100° C., but fluidity would be increased; as the air bubbles introduced may also expand, and the air bubbles easily escape from the surface of the resin coating film 11 having a thickness of less than about 10 μm. In addition, due to the baking, it is not limited to an overall uniformly increasing of the temperature. From this point of view, it is preferable that the temperature of the resin coating film 11 be easily uniformized by making sure that the initial stage of increasing of the temperature last sufficient time.

Second, in the case of using polyimide as the resin material 11*a*, as described above, the linear expansion coefficient varies according to the baking conditions. Therefore, as described above, the baking conditions can be baked under a condition that closes to the linear expansion coefficient of the substrate of the device or the supporting member 2. For example, although baking is performed at about 450° C. in the case of polyimide, the temperature is further increased to about 500° C., and when it is kept for more than about 10 minutes and less than about 60 minutes, the linear expansion coefficient can be reduced. In addition, after baking at 450° C., the linear expansion coefficient can be reduced by further maintaining the temperature for 30 minutes or longer. Conversely, when the temperature is increased by a large step (a step of the temperature is increased dramatically and maintained for a long period), the linear expansion coefficient can be increased. From these points of view, baking of the resin coating film 11 is preferably performed by gradually increasing the temperature step-by-step by more than 10° C. and less than 200° C. every 5 minutes or more and 120 minutes or less, and then it is increased to the baking temperature. The range can be further determined according to the characteristics of the target resin film, the resin material, and the like.

Next, as shown in FIG. 4, a desired baked pattern 3 is defined in the baked resin film 12 by irradiating lasers onto the baked resin film 12 attached to the supporting member 2, thus a resin film 1b (S3) having a supporting member is formed.

The irradiation of the laser is performed in a same manner as the conventional method. That is, as shown in FIG. 17, lasers are irradiated by passing the mask 83 formed of a metal plate or the like in which a desired pattern is formed and the optical lens 88. The lens 88 is not necessarily required, but is effective in obtaining the irradiation energy density of the processing surface. In this case, the lens 88 is disposed downstream along traveling direction of the lasers compared with the mask 83 and condenses the lasers. For example, in the case of using the lens 88 of 10 times, the energy density becomes 100 times, but the transfer pattern of the mask 83 becomes a one-tenth scale. By the laser irradiation, a portion of the baked resin film 12 is burned by the laser light passing through the opening of the mask. As a result, in accordance with the opening pattern of the mask irradiated with the lasers, fine patterns that are the same as or smaller than the opening pattern are formed on the baked resin film 12. Thereby, the resin film 1b with a supporting member that containing the baked resin film 12 having a fine pattern and closely attached to the supporting member 2 can be obtained.

Although the laser irradiation conditions differ depending on material and thickness of the processed baked resin film 12, and size and shape of the processed fine pattern 3. The laser pulse frequency is generally more than 1 Hz and less than 60 Hz, a pulse width of more than 1 nanosecond (nsec) and less than 15 nanoseconds, and the laser energy density is more than 0.01 J/m$^2$ and less than 1 J/cm$^2$ on an irradiation surface of every pulse.

In order to form a vapor deposition mask for vapor-depositing an organic layer of an organic EL display device, for example, the baked resin film 12 made of polyimide and having a thickness of 5 μm is irradiated by lasers having a wavelength of 355 nm (triple frequency of YAG laser), a pulse frequency of 60 Hz, a pulse width of 7 nsec, a laser energy density in the irradiation surface is 0.36 J/m$^2$ per pulse, and an emission number (a number of irradiation pulses) of 100, to define the openings each having a side length of 60 μm, the openings are arranged in a matrix at an interval of 60 μm.

However, the irritation laser is not limited to YAG laser and can be the laser that can be absorbed by the resin material. Thus, other lasers, such as an excimer laser and CO$_2$ laser, may also be used. Of course, when the laser source changes or the resin material changes, it goes without saying that the irradiation conditions also change. In the examples described above, although an irradiation was performed with an emission number of 100 in order to form the opening pattern, openings are defined in the polyimide film having a thickness of 5 μm with an emission number of approximately 50. Therefore, when grooves are defined in a diffraction grating or the like to be described later, the irradiation conditions are adjusted so that a beautiful groove having a predetermined depth is formed by a less and weaker output power.

Figure 5:
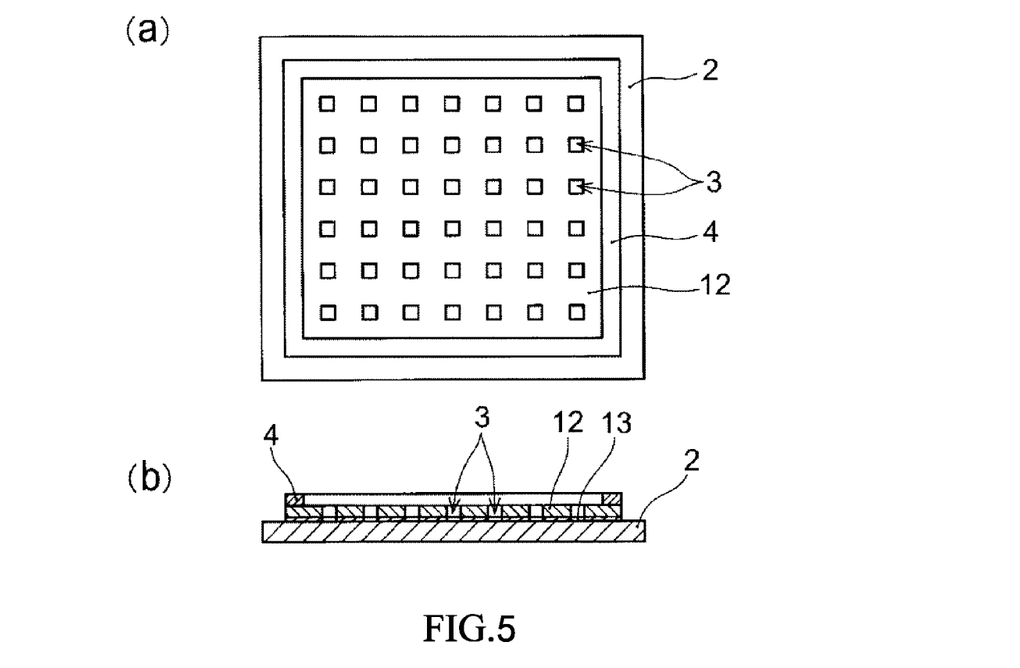
FIG. 5 is a plan and cross-section view illustrating an S4 step of the producing method of FIG. 1.

Next, as shown in FIG. 5, the frame 4 is attached to a periphery of the baked resin film 12 defining the fine pattern 3 (S4). After the baked resin film 12 is peeled from the supporting member 2 to form the resin film 1, the attachment of the frame 4 is performed in order to make a resin film 1 to be easily processed without damage. In a conventional manufacturing method, since it is necessary to introduce tension to the film while attaching to the frame, the frame needs to be so rigid that a metal plate having a thickness of more than 25 mm and less than 50 mm is used. This is called an extending step. However, in the embodiment of the present invention, since the frame is attached to the baked resin film 12 combined with the supporting member 2, the extending step can be omitted. As a result, the frame 4 is not essential or may not be provided. Therefore, the frame 4 may have a certain degree of mechanical strength, for example, a metal plate, a plastic plate, or the like having a thickness of more than 1 mm and less than 20 mm may be used.

Figure 6:
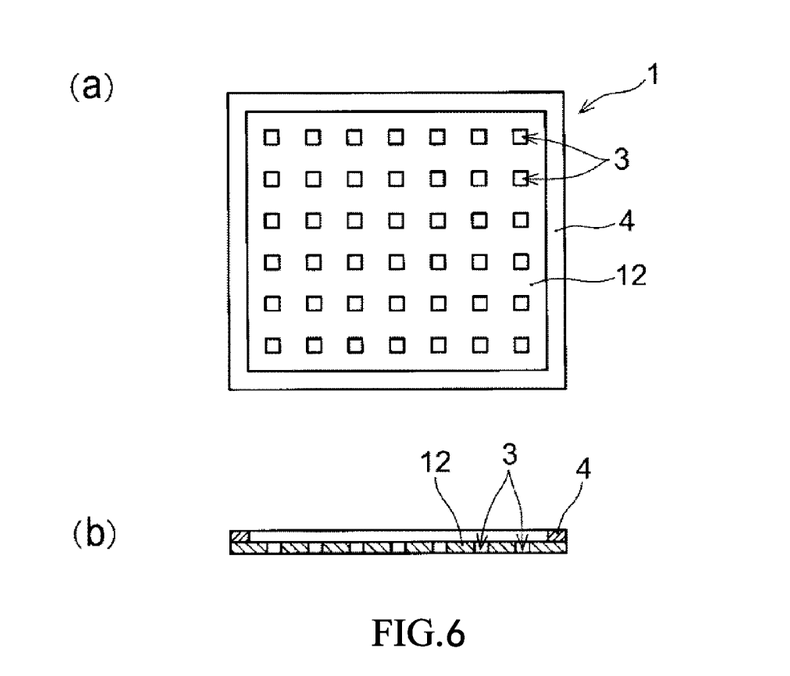
FIG. 6 is a plan and cross-section view illustrating an S5 step of the producing method of FIG. 1.

Thereafter, as shown in FIG. 6, the baked resin film 12 is peeled from the supporting member 2 to obtain the resin film 1 having the fine pattern (S5). Peeling the baked resin film 12 from the supporting member 2 is performed by further deteriorating the short-wavelength light absorbing layer 13 caused by the laser irradiation. That is, the laser irradiation at the time of forming the openings of the fine pattern is performed only by irradiating the opening-forming portion with laser light, and the short-wavelength light absorbing layer 13 in this portion would disappear. However, in this step, irradiation is performed on the whole. Therefore, a weak laser that does not deteriorate the baked resin film 12 is irradiated. From this point of view, it is also possible to use no laser but use a xenon lamp, a high-pressure mercury lamp, an ultraviolet LED, or the like as a light source for emitting light having a short wavelength.

By irradiating the short-wavelength light on the whole in this way, there is no change in the baked resin film 12; and the short-wavelength light absorbing layer 13 is further deteriorated to lose a bonding force between the supporting member 2 and the baked resin film 12, and is easily separated from the supporting member 2. Therefore, a cockamamie method, such as a conventional immersion into oil for separation, is not used. In additional, no unfavorable moisture is attached to the organic layer, and the baked resin film 12 can be peeled from the supporting member 2 without damaging the fine pattern.

As described above, the resin film 1 having the fine pattern is micro-fabricated while the baked resin film 12 is closely attached to the supporting member 2. Therefore, in the case of forming the openings of the fine pattern, no opening is formed in the air bubble portion. In addition, there is no floating or bulging portion at end of the openings. Therefore, the processing dust will not enter; the fine patterns will not deform and produce any burrs. As a result, in the case of forming an organic EL display device by depositing an organic layer using the vapor deposition mask having the resin film produced as described above, there is no difference between the pixels and the organic EL display device having very good display quality is obtained. In addition, in the case of optical elements such as diffraction grating, very high-performance optical elements are also obtained.

Next, A method for producing an organic EL display device using such a vapor deposition mask consisted of the resin film produced in this manner will be described. Since the producing method other than producing of the vapor deposition mask is performed by a well-known method, only the deposition method of the organic layer using a vapor deposition mask is described.

Figure 8:
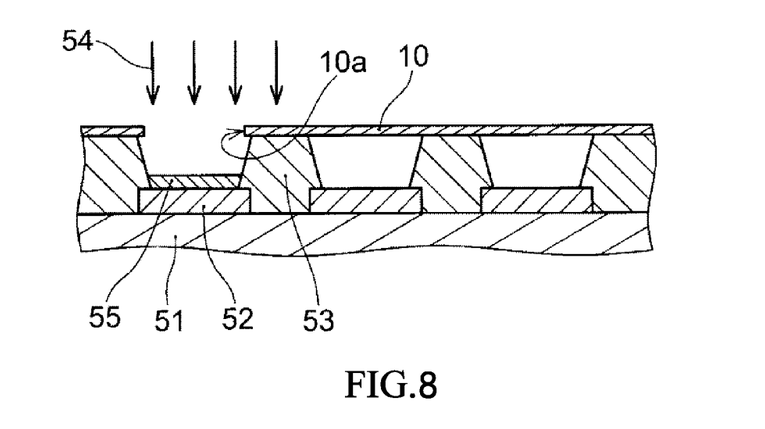
FIG. 8 is a view illustrating laminating an organic layer; the organic layer is configured for producing an organic EL display device using a vapor deposition mask made of a resin film formed in FIG. 6.
Figure 9:
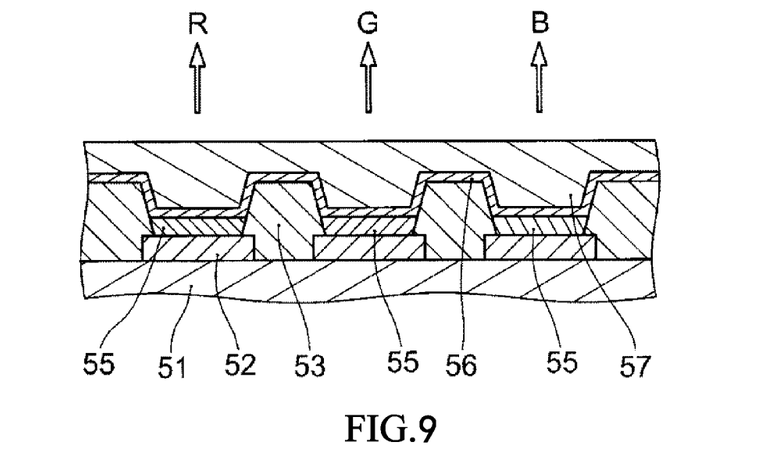
FIG. 9 is a view showing a state that the organic layer is formed in each sub-pixel of RGB by a method of FIG. 8.

The method for producing the organic EL display device of the present invention includes defining the openings pattern 3 (See FIG. 4) in the baked resin film 12 by laser irradiating in order to form the vapor deposition mask 10, the baked resin film 12 is formed by applying the liquid resin 11a onto the supporting member 2 (see FIG. 7) and baking. Then, as shown in FIG. 8 and FIG. 9, the vapor deposition mask 10 having the openings 10a is aligned with and superimposed on the substrate 51 on which the TFTs or the like (not shown) and the first electrodes 52 are formed, and then the organic material 54 is vapor deposited on a substrate (a first electrode 52) to form the organic layer 55. After the organic layer 55 of each sub-pixel is formed, a second electrode 56 is formed after removing the vapor deposition mask 10, thus the organic layer 55 of the organic EL display device is formed. Details may be further described by specific examples.

Although not illustrated in figures, the substrate 51 includes, for example, switching elements such as TFTs or the like corresponding to RGB sub-pixels of each pixel on such as a glass plate or the like, first electrodes (for example anodes) coupled to the switching elements on a planarized film, and a combination of metal (such as Ag or APC) films and ITO film. Insulating bank 53 made of $SiO_2$ or the like for shielding the sub-pixels is formed between the sub-pixels. The vapor deposition mask 10 is aligned with and fixed to the insulating bank 53 of the substrate 51. In addition, the opening 10a of the vapor deposition mask 10 is formed to be smaller than an interval of surface of the insulating bank 53. The sidewall of the insulating bank 53 deposits as little organic material as possible, thereby preventing the light-emitting efficiency from deteriorating.

In this state, the organic material 54 is vapor deposited in an deposition apparatus, and the organic material 54 is deposited only on the openings of the vapor deposition mask 10, and an organic layer 55 is formed on the first electrodes 52 of the desired sub-pixels. As described above, since the opening 10a of the vapor deposition mask 10 is formed to be smaller than the interval of the surface of the insulating bank 53, it becomes hard to deposit the organic material 54 on the side wall of the insulating bank 53. As a result, as shown in FIG. 8 and FIG. 9, the organic layer 55 is deposited almost only on the first electrodes 52. The vapor deposition masks are sequentially used, and the vapor deposition step is performed on each of the sub-pixels. As will be described later, there is also a case of using a vapor deposition mask that can vapor-deposit a same material onto a plurality of sub-pixels at a same time.

In FIG. 8 and FIG. 9, although the organic layer 55 is simply represented as a single layer, in practice, the organic layer 55 is consisted of a multilayer laminated film made of different materials. For example, the layer contacting with the anode 52 may be provided with a hole injecting layer made of a material having a good ionization energy integration for improving hole injectability. A hole transporting layer is on the hole injecting layer and is made of for example an amine material, the hole transporting layer is capable of enhancing the stable transport of holes and limiting the electrons (energy barrier) of the light-emitting layer. Further, a light-emitting layer is formed thereon and is selected according to the emission wavelength, for example the light-emitting layer is made of $Alq_3$ doped with red or green organic fluorescent material with respect to the red color and the green color. In addition, as a blue-color system material, a DSA-based organic material is used. An electron transporting layer made of $Alq_3$ or the like is further formed on the light-emitting layer, the electron transporting layer is capable of improving the electron injectability and stabilizing the transporting of electrons. The organic layer 55 is formed by respectively depositing the respective layers to tens of mm. In addition, an electron injection layer made of such as LiF or Liq may be provided between the organic layer and the metal electrode to improve electron injection properties.

The light-emitting layer includes the organic layers of a material corresponding to the respective colors of RGB deposited at the organic layer 55. In addition, the hole transporting layer, the electron transporting layer, and the like are preferably made of a material suitable for the light emitting layer, respectively, if the light emitting performance is important. However, considering cost of materials, there are cases that two or three RGB colors are jointly deposited with a same material. When a same material is deposited in sub-pixels of more than two colors, a vapor deposition mask in which openings are defined in common sub-pixels is formed. When the vapor deposition layer differs from each sub-pixel, for example, each vapor deposition mask 10 can be used to continuously vapor-deposit in the R sub-pixels, and in the case of vapor-depositing a same organic layer in the RGB sub-pixels, the organic layers of the sub-pixel are vapor-deposited to a lower side of the same organic layer, and vapor depositing of the organic layer of all pixels is completed at a same time at the same organic layer by using a vapor deposition mask having an opening formed in RGB sub-pixels.

Then, after all of the organic layers 55 and the electron injecting layers (such as LiF layer) are formed, the vapor deposition mask 10 is removed, and the second electrode (for example cathode) 56 is entirely formed. The example shown in FIG. 8 is a top emission type, and since the second electrode 56 emits light from an upper side, the second electrode 56 is made of a light-transmitting material and is made of, for example, a thin film of Mg—Ag eutectic film. Other can use Al or the like. In the case of a bottom emission type that emits light from a side of the substrate 51, the first electrode 52 is made of ITO, $In_3O_4$, or the like. The second electrode may be made of a metal having a small work function, such as Mg, K, Li, Al, or the like. A protecting film 57 made of, for example $Si_3N_4$ is formed on a surface of the second electrode 56. In addition, the whole is sealed with a sealing layer made of glass, a resin film, or the like (not shown), and the organic layer 55 cannot to absorb water. Alternatively, the organic layer may be made as common as possible, and a color filter may be provided on a surface of the organic layer.

Figure 10:
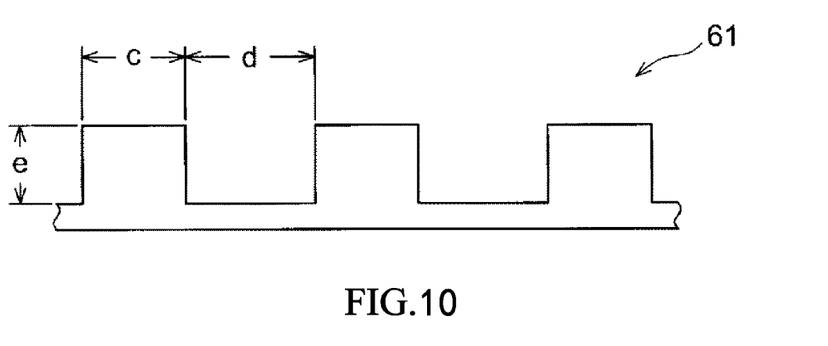
FIG. 10 is a cross-sectional view of an example of a diffraction grating formed by the resin film produced by the method of FIG. 1.
Figure 11:
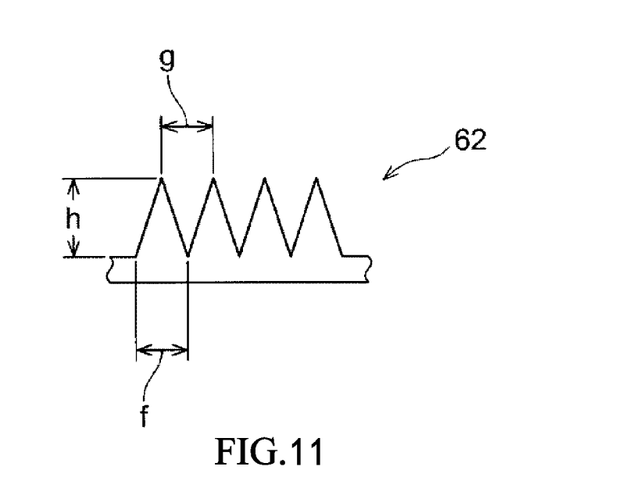
FIG. 11 is a cross-sectional view of an example of a moth-eye anti-reflection film formed by the resin film produced by the method of FIG. 1.

FIG. 10 and FIG. 11 show an example in which the resin film 1 is formed as an optical element such as a diffraction grating 61 or a moth-eye anti-reflection film 62. That is, FIG. 10 is a cross-sectional view showing the diffraction grating. The width c of a protrusion and a distance d between two protrusions are both more than 0.3 μm and less than 1 μm. When the depth e is more than 100 nm and less than 500 nm, as very fine pattern to a degree of light wavelength is required, when the resin film 1 only has a few unnecessary concaves-convexes, thus the fine pattern cannot accurately formed. This is because; a problem may arise even though air bubbles are smaller than those in the case of the vapor deposition mask. However, as described above, the resin film 1 of the present invention is micro-fabricated in a state of being closely attached to the supporting member, and an accurate diffraction grating without missing parts can be obtained. Therefore, a clear diffraction image can be obtained.

In addition, an example shown in FIG. 11 is an example of a moth-eye anti-reflection film. For example, in this example, very fine concaves-convexes having a width (bottom diameter) f of more than 50 nm and less than 200 nm, a distance g of more than 50 nm and less than 300 nm, and a height of more than 200 nm and less than 3000 nm are formed, but a precise fine structure can be formed as with the diffraction grating. In addition, although the top end of the convex portion in the drawing is drawn as a sharp shape, it may have a circular shape. In order to form such concaves-convexes by laser irradiation, for example, a mask can be obtained by a mask having a gradually varying transmittance that a large transmittance of laser light in the central portion of the concave portion and transmittance decreasing toward peripheral thereof.

REFERENCE SIGNS LIST 1 resin film
1a base film
1b resin film 1b having a supporting member
2 supporting member
3 fine patterns
4 frame
5 slit die
10 vapor deposition mask
11 resin coating film
11a resin material
12 baked resin film
13 short-wavelength light absorbing layer
51 substrate
52 first electrode
53 insulating bank
54 organic material
55 organic layer
56 second electrode
57 protecting film
61 diffraction grating
62 anti-reflection film

The invention claimed is:

1. A method for producing a resin film having a fine pattern, comprising:
    applying a liquid resin material to a supporting member to form a resin coating film;
    increasing a temperature of the resin coating film to a curing temperature of the resin material and baking the resin coating film to form a baked resin film;
    irradiating the baked resin film attached to the supporting member with a laser, to form a desired pattern in the baked resin film; and
    peeling the baked resin film from the supporting member;
    wherein when peeling the resin film from the supporting member, a light is irradiated to an interface between the resin film and the supporting member to weaken adhesion between the resin film and the supporting member.

2. The method of claim 1, wherein at least one of a coating thickness of the resin material, a temperature of the baking, a time of the baking, and a distribution of baking temperature and baking time is adjusted when baking the resin coating film, to make a difference between a linear expansion coefficient of the baked resin film and a linear expansion coefficient of the supporting member less than 3 ppm/° C.

3. The method of claim 1, wherein the supporting member is selected to make a difference between a linear expansion coefficient of the supporting member and a linear expansion coefficient of the supporting member less than 6 ppm/° C.

4. The method of claim 3, wherein the processing by irradiating with a lasers is performed to form a vapor deposition mask configured to deposit organic material for each pixel on a substrate.

5. The method of claim 1, wherein baking of the resin coating film is performed by gradually increasing the temperature step-by-step by more than 10° C. and less than 200° C. every 5 minutes to 120 minutes to a baking temperature.

6. The method of claim 1, wherein the processing by irradiating with a laser is performed to form a fine opening pattern of the baked resin film.

7. The method of claim 6, wherein the laser is a pulsed laser having a frequency of more than 1 Hz and less than 60 Hz, a pulse width of more than 1 nanosecond (nsec) and less than 15 nanoseconds, and a laser energy density of more than 0.01 J/m$^2$ and less than 1 J/cm$^2$ on an irradiation surface of every pulse.

8. The method of claim 1, wherein a frame is formed on a peripheral portion of the baked resin film prior to peeling the baked resin film from the supporting member.

9. A method for producing an organic EL display device, which is a method of depositing an organic layer on a substrate to produce the organic EL display device, the method comprising:
    forming an opening pattern in a baked resin film by irradiating with lasers to form a vapor deposition mask, wherein the baked resin film is formed by applying a liquid resin material to a supporting member and baking; wherein the baked resin film is peeled from the supporting member by irradiating light to an interface between the resin film and the supporting member to weaken adhesion between the resin film and the supporting member;
    aligning the vapor deposition mask with and superimposing it on a substrate on which a first electrode is formed, and vapor depositing organic material on the substrate to form an organic layer; and
    removing the vapor deposition mask to form a second electrode.

* * * * *